(12) United States Patent
Park et al.

(10) Patent No.: US 9,184,068 B2
(45) Date of Patent: Nov. 10, 2015

(54) SUBSTRATE TREATING APPARATUS FOR ADJUSTING TEMPERATURE OF TREATING LIQUID

(75) Inventors: Sang Uk Park, Cheonan (KR); Jae Seung Go, Suwon (KR)

(73) Assignee: SEMES CO., LTD., Chungcheongnam-do (KR)

( * ) Notice: Subject to any disclaimer, the term of this patent is extended or adjusted under 35 U.S.C. 154(b) by 1218 days.

(21) Appl. No.: 12/621,022

(22) Filed: Nov. 18, 2009

(65) Prior Publication Data
US 2010/0133355 A1   Jun. 3, 2010

(30) Foreign Application Priority Data

Nov. 28, 2008 (KR) .................. 10-2008-0119904

(51) Int. Cl.
| | | |
|---|---|---|
| *B05B 7/16* | (2006.01) | |
| *H01L 21/67* | (2006.01) | |
| *B05C 11/10* | (2006.01) | |
| *B05B 9/00* | (2006.01) | |
| *G03F 7/16* | (2006.01) | |

(52) U.S. Cl.
CPC .......... *H01L 21/67103* (2013.01); *B05B 9/002* (2013.01); *B05C 11/1042* (2013.01); *G03F 7/162* (2013.01); *H01L 21/6708* (2013.01); *H01L 21/6715* (2013.01); *H01L 21/67051* (2013.01); *H01L 21/67109* (2013.01); *H05B 2203/032* (2013.01)

(58) Field of Classification Search
CPC .... B05B 7/1653; B05B 7/1673; B05B 9/002; B05B 12/10; B05C 11/1042; B05C 9/14; B05C 5/001; H05B 2203/032; H05B 3/00; H05B 6/108; B05D 1/005; H01L 21/6708; H01L 21/67109; H01L 21/67103
USPC ........................................... 118/302; 239/128
See application file for complete search history.

(56) References Cited

U.S. PATENT DOCUMENTS

| | | | | | |
|---|---|---|---|---|---|
| 4,284,670 | A | * | 8/1981 | Kole | 427/422 |
| 4,383,645 | A | * | 5/1983 | Figiel et al. | 239/13 |
| 4,644,140 | A | * | 2/1987 | Hillinger | 219/535 |
| 4,734,227 | A | * | 3/1988 | Smith | 264/13 |
| 4,932,353 | A | * | 6/1990 | Kawata et al. | 118/302 |
| 4,998,502 | A | * | 3/1991 | Schucker | 118/667 |

(Continued)

FOREIGN PATENT DOCUMENTS

| | | |
|---|---|---|
| CN | 1435732 A | 8/2003 |
| JP | 06-291027 A | 10/1994 |

(Continued)

*Primary Examiner* — Dah-Wei Yuan
*Assistant Examiner* — Karl Kurple
(74) *Attorney, Agent, or Firm* — Carter, DeLuca, Farrell & Schmidt, LLP

(57) ABSTRACT

Provided are a treating liquid supplying unit, and a substrate processing apparatus and method using the same. Temperature of treating liquid in a treating liquid pipe built into a nozzle arm can be maintained, through heat transfer between the nozzle arm and a standby port and heat transfer between the nozzle arm and a nozzle moving unit, while the nozzle arm is standing by in standby position, while processing is being performed at a processing position, and during movement between the standby position and a processing position. Thus, treating liquid supplied from a nozzle can be maintained at a predetermined temperature by the treating liquid supplying unit, and the substrate processing apparatus and method using the same.

3 Claims, 11 Drawing Sheets

(56) References Cited

U.S. PATENT DOCUMENTS

| | | | | |
|---|---|---|---|---|
| 5,002,008 | A | * | 3/1991 | Ushijima et al. ............... 118/313 |
| 5,287,913 | A | * | 2/1994 | Dunning et al. .............. 165/243 |
| 5,578,127 | A | * | 11/1996 | Kimura ......................... 118/695 |
| 5,658,615 | A | * | 8/1997 | Hasebe et al. ................. 427/240 |
| 5,849,084 | A | * | 12/1998 | Hayes et al. ................... 118/320 |
| 5,960,225 | A | * | 9/1999 | Fujimoto ....................... 396/611 |
| 6,374,769 | B1 | * | 4/2002 | Pesavento et al. .............. 118/46 |
| 6,416,583 | B1 | * | 7/2002 | Kitano et al. .................. 118/680 |
| 6,427,717 | B1 | * | 8/2002 | Kimura ......................... 137/340 |
| 6,453,659 | B1 | * | 9/2002 | Van Liere et al. ............ 60/39.53 |
| 6,494,953 | B2 | * | 12/2002 | Hayes et al. ..................... 118/52 |
| 6,514,344 | B2 | * | 2/2003 | Kitano et al. .................. 118/323 |
| 6,592,932 | B2 | * | 7/2003 | Subramanian et al. .......... 427/10 |
| 7,041,172 | B2 | * | 5/2006 | Bem et al. ..................... 118/313 |
| 7,153,364 | B1 | * | 12/2006 | Rangarajan et al. ........... 118/326 |
| 7,326,299 | B2 | * | 2/2008 | Muramatsu et al. .......... 118/302 |
| 7,694,894 | B2 | * | 4/2010 | Warren et al. ................ 239/137 |
| 7,707,961 | B2 | * | 5/2010 | Alexander et al. ............ 118/302 |
| 7,875,420 | B2 | * | 1/2011 | Inatomi ......................... 430/331 |
| 8,919,666 | B2 | * | 12/2014 | Warren et al. ................ 239/137 |
| 2002/0043214 | A1 | * | 4/2002 | Inada et al. ................... 118/668 |
| 2003/0079787 | A1 | * | 5/2003 | Heise ............................... 138/33 |
| 2004/0226505 | A1 | * | 11/2004 | Goto et al. .................... 118/300 |
| 2005/0186351 | A1 | * | 8/2005 | Fung et al. .................... 427/420 |
| 2008/0087217 | A1 | * | 4/2008 | Yudasaka ....................... 118/313 |
| 2009/0033898 | A1 | * | 2/2009 | Yamamoto et al. ............. 355/53 |
| 2009/0061642 | A1 | * | 3/2009 | Ha ................................. 438/745 |
| 2009/0120468 | A1 | * | 5/2009 | Kim et al. .................. 134/104.2 |
| 2009/0165950 | A1 | * | 7/2009 | Kim et al. .................. 156/345.1 |
| 2009/0189938 | A1 | * | 7/2009 | Kojima ............................ 347/14 |
| 2010/0146813 | A1 | * | 6/2010 | Jeong et al. ..................... 34/519 |
| 2011/0059245 | A1 | * | 3/2011 | Miyamoto et al. ............ 427/345 |
| 2011/0059574 | A1 | * | 3/2011 | Miyamoto et al. ............ 438/95 |
| 2014/0326752 | A1 | * | 11/2014 | Chesterfield et al. ......... 222/131 |

FOREIGN PATENT DOCUMENTS

| | | | |
|---|---|---|---|
| JP | 10-256127 | | 9/1998 |
| JP | 10256127 | * | 9/1998 |
| JP | 2003-062504 A | | 3/2003 |
| JP | 2004-172628 A | | 6/2004 |
| KR | 10-0142807 | | 4/1998 |
| KR | 1020030066410 A | | 8/2003 |

* cited by examiner

Prior Art

SUBSTRATE TREATING APPARATUS FOR ADJUSTING TEMPERATURE OF TREATING LIQUID

CROSS-REFERENCE TO RELATED APPLICATIONS

This U.S. non-provisional patent application claims priority under 35 U.S.C. §119 of Korean Patent Application No. 10-2008-0119904, filed on Nov. 28, 2008, the entire contents of which are hereby incorporated by reference.

BACKGROUND OF THE INVENTION

The present invention disclosed herein relates to a semiconductor manufacturing apparatus and method, and more particularly, to a unit for supplying treating liquid to a substrate, and an apparatus and method for treating a substrate using the same.

In general, a semiconductor device is manufactured by stacking and patterning a plurality of different materials in thin film form on a substrate. For this end, many stages of different processes such as deposition, photolithography, etch, and cleaning processes are required.

Of these processes, photolithography processes include deposition processes for depositing a photosensitive liquid on a substrate, and developing processes for supplying a developing liquid on a substrate, etch processes include processes for supplying an etch liquid on a substrate and removing a developed film from the substrate, and cleaning processes include processes for supplying cleaning liquid on a substrate and removing residual impurities from the surface of the substrate.

Deposition, developing, etch, and cleaning processes are performed using a spin-type method in which a substrate is placed on a spin chuck and treating liquid (photosensitive liquid, developing liquid, etch liquid, or cleaning liquid) is supplied to the surface of the substrate while the substrate is rotated.

SUMMARY OF THE INVENTION

The present invention provides a unit for supplying treating liquid, capable of maintaining treating liquid supplied through a nozzle arm at a predetermined temperature while the nozzle arm is standing by in standby position, while processing is being performed at a processing position, and during movement between the standby position and a processing position, and a substrate treating apparatus and method using the unit for supplying treating liquid.

The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Embodiments of the present invention provide substrate processing apparatuses including: a substrate supporting unit for supporting a substrate; a nozzle arm having a nozzle mounted thereon for discharging treating liquid to the substrate placed on the substrate supporting unit, and having a treating liquid pipe built therein for supplying the treating liquid to the nozzle; and a standby port providing a location in which the nozzle arm stands by for processing, and adjusting a temperature of the treating liquid in the treating liquid pipe built into the nozzle arm, through heat transfer with the nozzle arm.

In some embodiments, the standby port may include: an arm supporting member on which the nozzle arm is placed; and a first temperature adjusting member provided on the arm supporting member, for adjusting the temperature of the arm supporting member.

In other embodiments, the first temperature adjusting member may include one of a heating coil, a temperature adjusting liquid pipe, a thermoelectric element, and a combination thereof.

In still other embodiments, the arm supporting member may have a block shape with a lengthwise direction corresponding to the nozzle arm and surface-contacts a lower end of the nozzle arm along a length of the nozzle arm to transfer heat to the nozzle arm through heat conduction, and the first temperature adjusting member may be built in the arm supporting member.

In even other embodiments, the substrate processing apparatus may further include a nozzle moving unit for moving the nozzle arm between the standby location of the standby port and a processing location at an upper portion of the substrate, and for adjusting the temperature of the treating liquid in the treating liquid pipe built into the nozzle arm, through transferring heat of the nozzle arm that moves.

In yet other embodiments, the standby port may be provided in plurality in side-by-side arrangement along a side of the substrate supporting unit, the nozzle arm with the nozzle mounted thereon may be respectively disposed at each of the standby ports, and the nozzle moving unit may select one from the plurality of the nozzle arms and move the selected nozzle arm from the standby location of the standby port to the processing location at the upper portion of the substrate.

In further embodiments, the nozzle moving unit may include: a holding member for holding the nozzle arm; a second temperature adjusting member provided on the holding member, for adjusting a temperature of the holding member; and a moving member for moving the holding member between the standby location and the processing location.

In still further embodiments, the holding member may include: a first and a second holder for holding the nozzle arm through moving farther from or closer to one another along directions perpendicular to a lengthwise direction of the nozzle arm; and a first driver for driving the first and the second holders.

In even further embodiments, the first and the second holders may respectively include a sidewall disposed perpendicularly in contact with a side of the nozzle arm, and a bottom wall extending horizontally from the sidewall to contact a bottom of the nozzle arm, and the second temperature adjusting member may be contained in the sidewalls of the first and the second holders.

In yet further embodiments, the second temperature adjusting member may be one of a heating coil, a temperature adjusting liquid pipe, a thermoelectric element, and a combination thereof.

In much further embodiments, the moving member may include: a horizontal support for supporting the holding member; a moving rod perpendicularly connected to the horizontal support, and having a second driver installed thereon for vertically moving the horizontal support; and a third driver for moving the moving rod between the standby location and the processing location.

In still much further embodiments, the substrate processing apparatus may further include a heat pipe disposed between an inner wall of the nozzle arm and the treating liquid pipe, for transferring heat between the nozzle arm and the treating liquid pipe.

In other embodiments of the present invention, substrate processing apparatuses include: a substrate supporting unit for supporting a substrate; a nozzle arm having a nozzle mounted thereon for discharging treating liquid to the substrate placed on the substrate supporting unit, and having a treating liquid pipe built therein for supplying the treating liquid to the nozzle; and a nozzle moving unit for moving the nozzle arm and adjusting a temperature of the treating liquid in the treating liquid pipe built into the nozzle arm, through heat transfer with the nozzle arm.

In some embodiments, the nozzle moving unit may include: a holding member for holding the nozzle arm; a temperature adjusting member provided on the holding member, for adjusting a temperature of the holding member; and a moving member for moving the holding member between a standby location and a processing location.

In other embodiments, the holding member may include: a first and a second holder for holding the nozzle arm through moving farther from or closer to one another along directions perpendicular to a lengthwise direction of the nozzle arm; and a first driver for driving the first and the second holders.

In still other embodiments, the first and the second holders may respectively include a sidewall disposed perpendicularly in contact with a side of the nozzle arm, and a bottom wall extending horizontally from the sidewall to contact a bottom of the nozzle arm, and the temperature adjusting member may be contained in the sidewalls of the first and the second holders.

In even other embodiments, the temperature adjusting member may be one of a heating coil, a temperature adjusting liquid pipe, a thermoelectric element, and a combination thereof.

In yet other embodiments, the moving member may include: a horizontal support for supporting the holding member; a moving rod perpendicularly connected to the horizontal support, and having a second driver installed thereon for vertically moving the horizontal support; and a third driver for moving the moving rod between the standby location and the processing location.

In further embodiments, the substrate processing apparatus may further include a heat pipe disposed between an inner wall of the nozzle arm and the treating liquid pipe, for transferring heat between the nozzle arm and the treating liquid pipe.

In still further embodiments, the substrate processing apparatus may further include a standby port providing a location in which the nozzle arm stands by for processing, wherein the nozzle moving unit may move the nozzle arm between the standby location provided by the standby port and a processing location at an upper portion of the substrate.

In even further embodiments, the standby port may be provided in plurality in side-by-side arrangement along a side of the substrate supporting unit, the nozzle arm with the nozzle mounted thereon may be respectively disposed at each of the standby ports, and the nozzle moving unit may select one from the plurality of the nozzle arms and move the selected nozzle arm from the standby location provided by the standby port to the processing location at the upper portion of the substrate.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
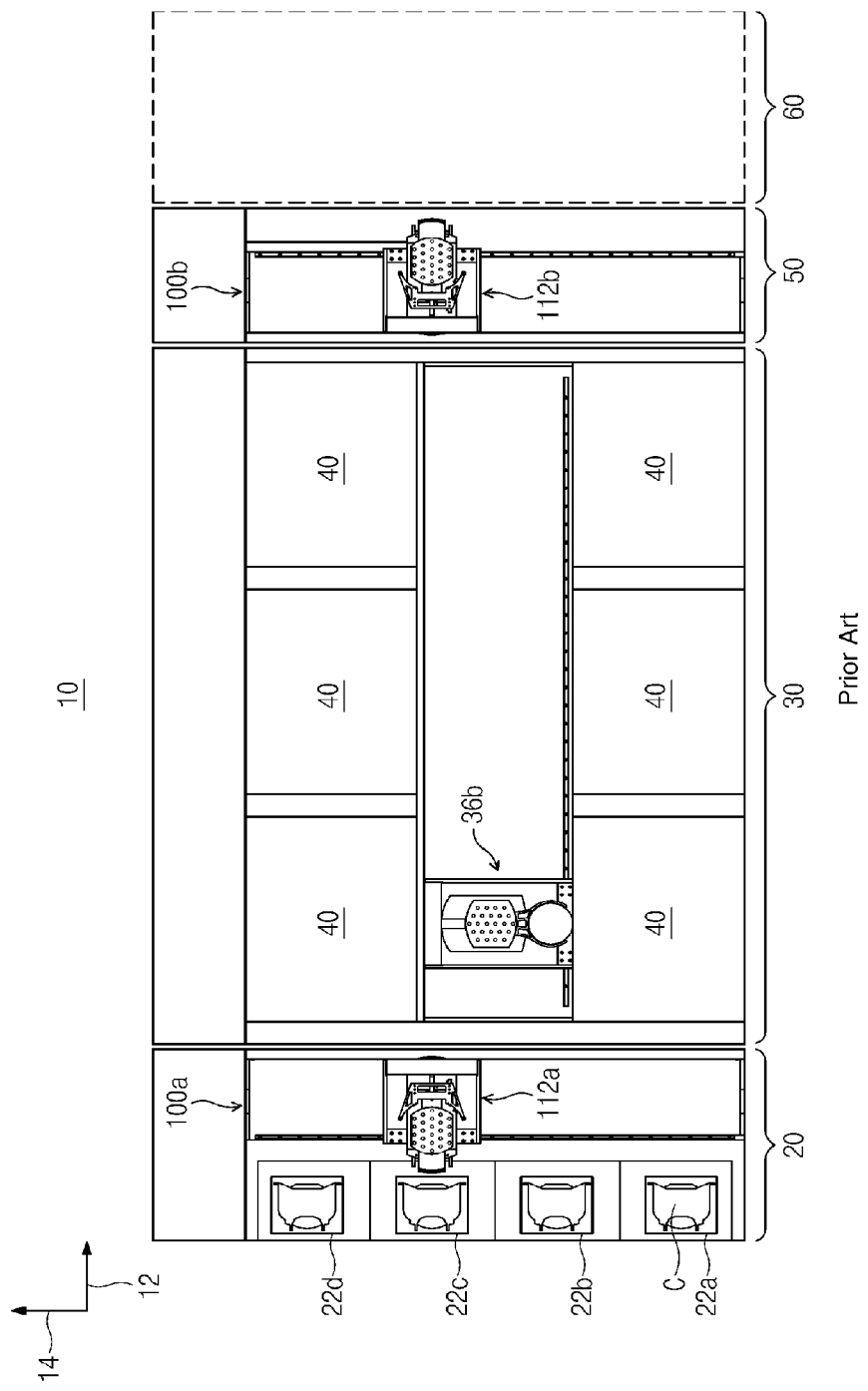
FIG. 1 is a plan view of semiconductor manufacturing equipment provided with a substrate treating apparatus according to an embodiment of the present invention.

A unit for supplying treating liquid, and an apparatus and method for treating a substrate using the same according to preferred embodiments of the present invention will be described below in more detail with reference to the accompanying drawings. Regarding the reference numerals assigned to the elements in the drawings, it should be noted that like reference numerals are used for like elements throughout the drawings wherever possible. Also, in the description of embodiments, detailed description of well-known related structures or functions are not provided when it is deemed that such description will cause ambiguous interpretation of the present invention.

Embodiments

In embodiments, while semiconductor manufacturing equipment for performing coating and developing processes are exemplarily described, the technical scope of the present invention shall not be limited thereto, and the present invention may be applied to semiconductor manufacturing equipment for processing substrates using cleaning liquid or etchant, or various other types of chemical liquids.

Figure 2:
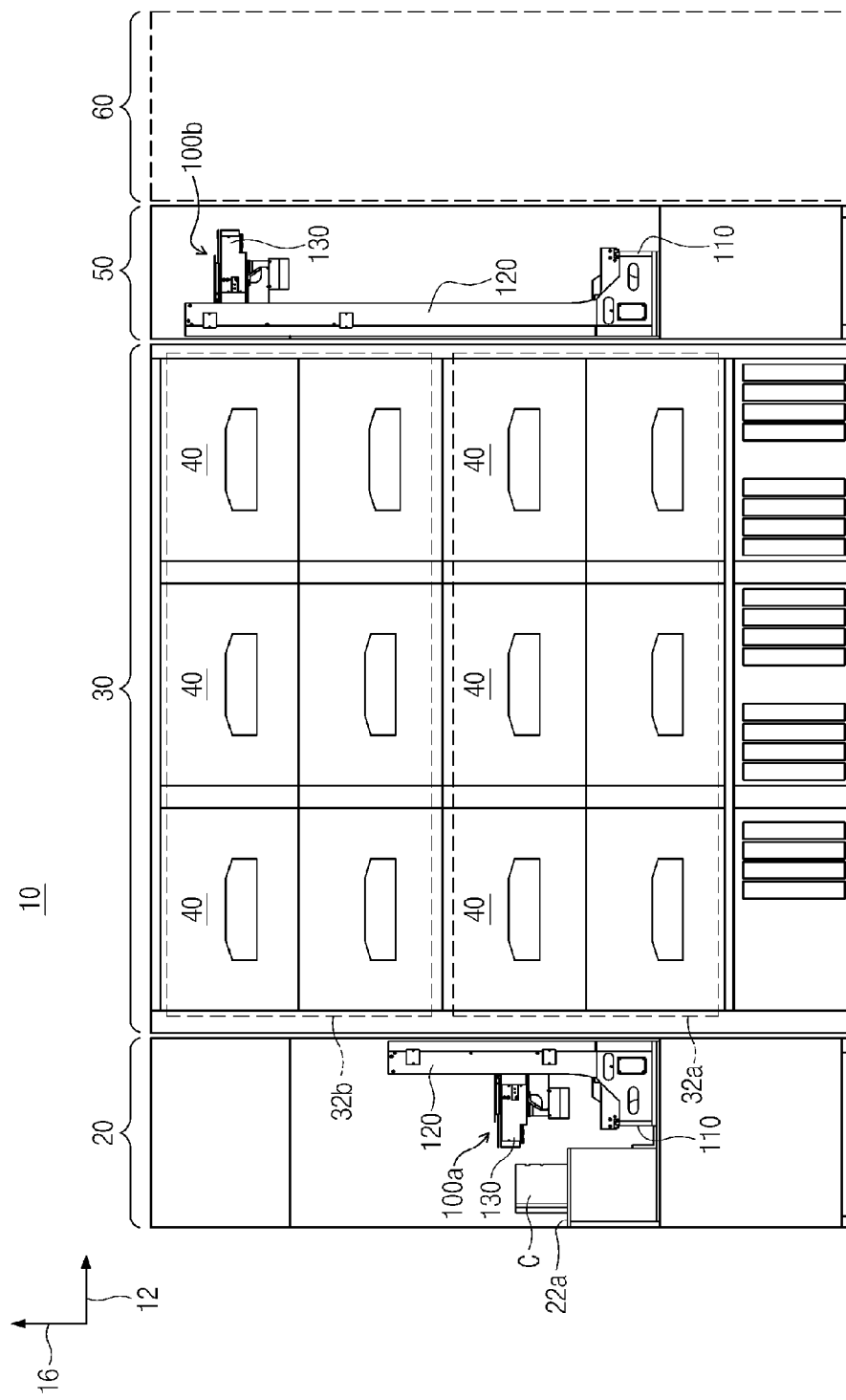
FIG. 2 is a side view of the semiconductor manufacturing equipment in FIG. 1.
Figure 3:
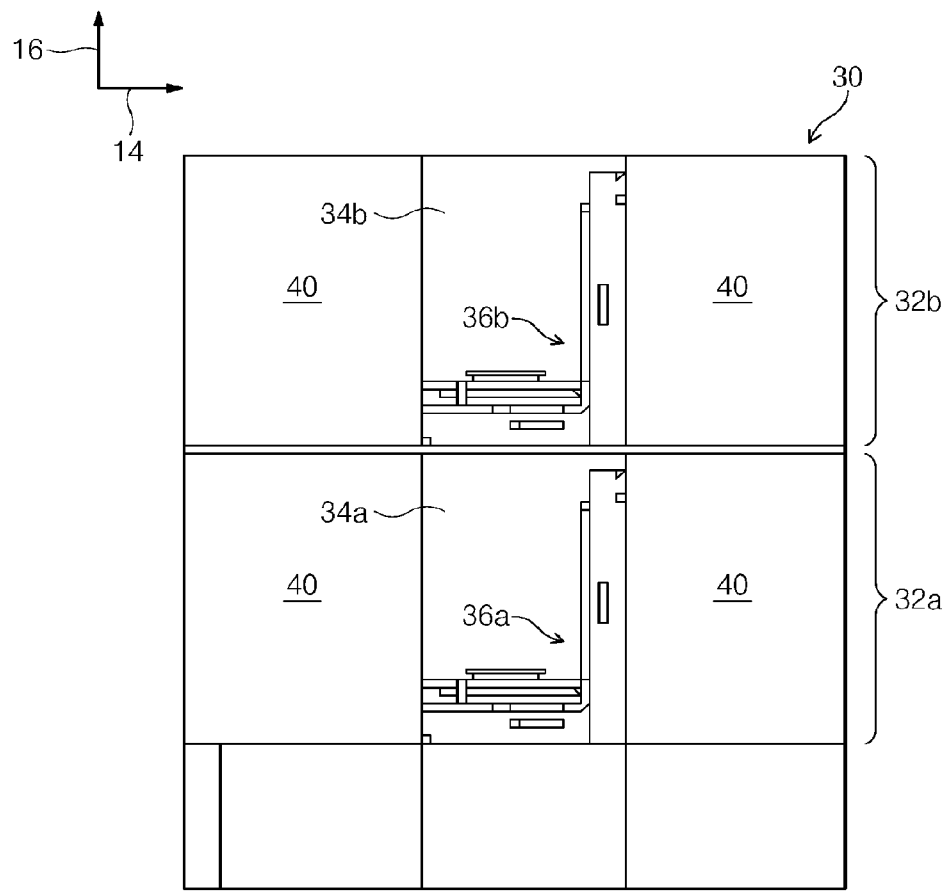
FIG. 3 is a view illustrating a processing unit of the semiconductor manufacturing equipment in FIG. 1.

FIG. 1 is a plan view of semiconductor manufacturing equipment provided with a substrate treating apparatus according to an embodiment of the present invention, FIG. 2 is a side view of the semiconductor manufacturing equipment in FIG. 1, and FIG. 3 is a view illustrating a processing unit of the semiconductor manufacturing equipment in FIG. 1.

Referring to FIGS. 1 through 3, semiconductor manufacturing equipment 10 includes an index 20, a processing unit 30, and an interface 50. The index 20, processing unit 30, and interface 50 are arranged side-by-side in a first direction 12. The index 20 is disposed next to the front end of the processing unit 30 along the first direction 12, and the interface 50 is disposed next to the rear end of the processing unit 30 along the first direction 12. The index 20 and the interface 50 are disposed so that their lengthwise directions are perpendicular to the first direction 12. The processing unit 30 has a multi-level structure of a plurality of levels stacked vertically. A first processing unit 32a is disposed at the lower level, and a second processing unit 32b is disposed on the upper level. The index 20 and the interface 50 load and unload substrates to and from the processing unit 30.

The first processing unit 32a includes a first conveying passage 34a, a first main robot 36a, and processing modules 40. The first conveying passage 34a is provided extending from a position adjacent to the index 20 to a position adjacent to the interface 50. Processing modules 40 are disposed at both sides of the first conveying passage 34a along the lengthwise direction of the first conveying passage 34a, and the first main robot 36a is installed in the first conveying passage 34a. The main robot 36a conveys substrates between the index 20, processing modules 40, and interface 50.

The second conveying unit 32b includes a second conveying passage 34b, a second main robot 36b, and processing modules 40. The second conveying passage 34b is provided extending in the first direction 12 from a position next to the index 22 to a position next to the interface 50. Processing modules 40 are disposed at both sides of the second conveying passage 34b along the lengthwise direction of the second conveying passage 34b, and the second main robot 36b is installed in the second conveying passage 34b. The second main robot 36b conveys substrates between the index 20, the processing module 40, and the interface 50.

The first processing unit 32a may have modules for performing a coating process, and the second processing unit 32b may have modules for performing a developing process. Conversely, the first processing unit 32a may have modules for performing developing processes, and the second processing unit 32b may have modules for performing coating processes. Also, the first and second processing units 32a and 32b may have modules for performing both coating processes and developing processes.

Examples of modules for performing coating include modules for performing adhesion, modules for performing cooling of substrates, modules for performing coating of photosensitive liquid, and modules for performing soft bake processes. Examples of modules for performing developing include modules for heating exposed substrates to a predetermined temperature, modules for cooling substrates, modules for supplying developing liquid on a substrate and removing an exposed region or a reverse region, and modules for performing hard bake processes.

The index 20 is installed at the front end of the processing unit 30. The index 20 has load ports 22a, 22b, 22c, and 22d in which cassettes C holding substrates are placed, and an index robot 100a. The load ports 22a, 22b, 22c, and 22d are arranged side-by-side in a second direction 14, and the index robot 100a is disposed between the load ports 22a, 22b, 22c, and 22d and the processing unit 30. A container C holding substrates is placed on the load ports 22a, 22b, 22c, and 22d by conveying means (not shown) such as an overhead transfer, an overhead conveyor, or not automatic guided vehicle. The container C used may be a sealed container such as a front open unified pod (FOUP). The index robot 100a conveys substrates between the container C placed in the load ports 22a, 22b, 22c, and 22d and the processing unit 30.

The interface 50 is installed at the rear end of the processing unit 30 to be symmetrical with the index 20 with respect to the processing unit 30. The interface 50 has an interface robot 100b. The interface robot 100b conveys substrates between a exposing unit 60 connected at the rear end of the interface 50, and the processing unit 30.

The index robot 100a has a horizontal guide 110, a vertical guide 120, and a robot arm 130. The robot arm 130 is capable of linear movement in the first direction 12 and can rotate about a central Z-axis. The horizontal guide 110 guides linear movement of the robot arm 130 in the second direction 14, and the vertical guide 120 guides linear movement of the robot arm 130 in a third direction 16. The interface robot 100b may have the same structure as the index robot 100a.

A description on the operation of the semiconductor manufacturing equipment 10 having the above configuration will be provided below. A cassette C holding substrates is placed in the load port 22a of the index 20 by an operator or conveying means (not shown). The index robot 100a loads substrates from the cassette C placed in the load port 22a and transfers the substrates to the first main robot 36a of the first processing unit 32a. The first main robot 36a moves along the first conveying passage 34a and loads substrates in each processing module 40. When coating process of the substrates in the processing modules 40 is completed, the first main robot 36a unloads the processed substrates from the processing modules 40, and transfers the unloaded substrates to the interface robot 100b. The interface robot 100b conveys the substrates to exposing unit 60. When exposing is completed in the exposing unit 60, the substrates are transferred to the second main robot 36b of the second processing unit 32b by the interface robot 100b. The second main robot 36b moves along the second conveying passage 34b and loads substrates in each processing module 40. When developing process of the substrates in the processing module 40 is completed, the second main robot 36b unloads the process substrates from the processing module 40, transfers the unloaded substrates to the index robot 100a. The index robot 100a loads the substrates in the cassette C placed in the load port 22a.

Figure 4:
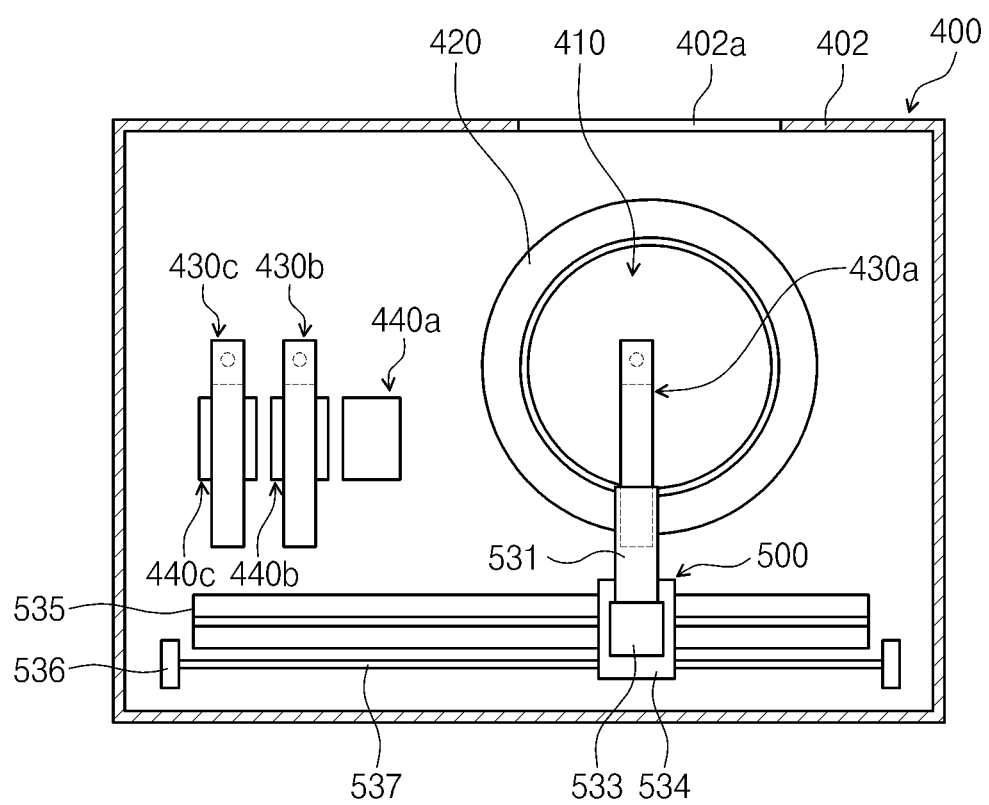
FIG. 4 is a plan view illustrating an example of a substrate treating apparatus according to the present invention.
Figure 5:
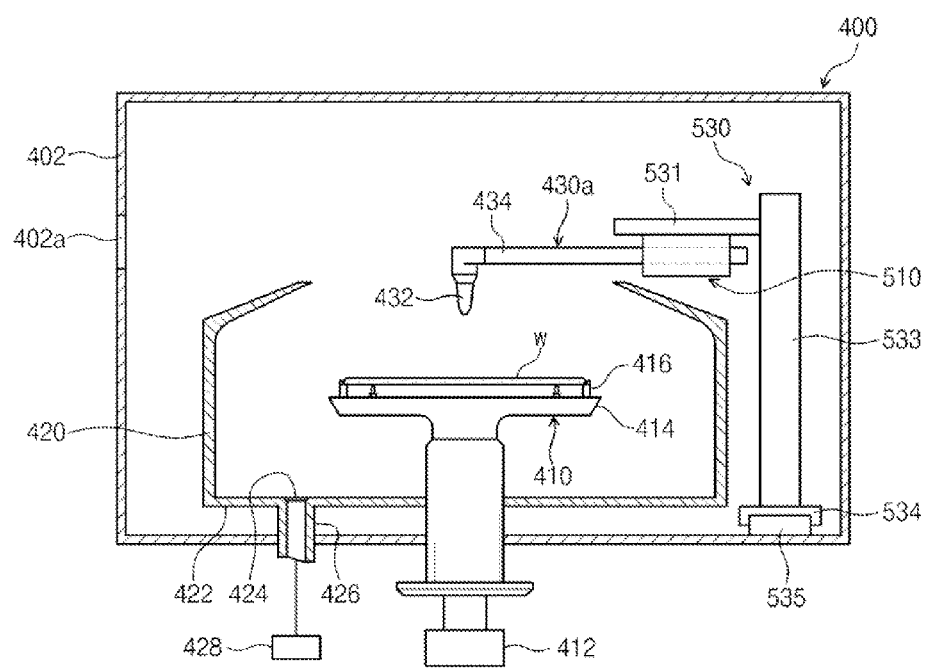
FIG. 5 is a side sectional view of the substrate treating apparatus in FIG. 4.

FIG. 4 is a plan view illustrating an example of a substrate treating apparatus according to the present invention, and FIG. 5 is a side sectional view of the substrate treating apparatus in FIG. 4.

Referring to FIGS. 4 and 5, a processing module 40 includes a processing chamber 400, a substrate supporting unit 410, a container 420, and a treating liquid supplying unit. The processing chamber 400 provides a space in which substrate processing is performed. An opening 402a for loading/unloading substrates into/from the processing chamber 400 is defined in a sidewall 402 of the processing chamber 400. The substrate supporting unit 410 is disposed inside the processing chamber 400, and the container 420 is disposed around the perimeter of the substrate supporting unit 410. The substrate supporting unit 410 supports substrates, and is provided to be capable of rotating. The container 420 collects treating liquid scattered from the rotation of the substrates. The treating liquid supplying unit supplies treating liquid onto substrates placed on the substrate supporting unit 410 to treat the substrates.

The substrate supporting unit 410 supports a substrate W during processing, and is rotated by a rotation driving member 412 such as a motor during processing. The substrate supporting unit 410 has a supporting plate 414 with a round upper surface, and a pin member 416 for supporting the substrate W is installed on the upper surface of the supporting plate 414.

The container 420 is disposed around the perimeter of the substrate supporting unit 410. The container 420 has an overall cylindrical shape, an exhaust hole 424 is defined in a lower wall 422 thereof, and an exhaust pipe 426 is installed to communicate with the exhaust hole 424. An exhaust member 428 such as a pump is connected to the exhaust pipe 426, and the exhaust member 428 provides negative pressure for exhausting air in the container 420 together with treating liquid that has been scattered from the rotation of the substrate W.

The treating liquid supplying unit supplies treating liquid onto a top surface of a substrate W placed on the substrate supporting unit 410. The treating liquid supplying unit includes treating liquid supplying members 430a, 430b, and 430c, standby ports 440a, 440b, and 440c, and a nozzle moving unit 500. The treating liquid supplying members 430a, 430b, and 430c may be provided in plurality depending on the type of treating liquid that is used. The standby ports 440a, 440b, and 440c provide standby locations for the treating liquid supplying members 430a, 430b, and 430c to perform processing. The nozzle moving unit 500 selects one of the treating liquid supplying members 430a, 430b, and 430c (for example, 430a), and moves the selected treating liquid supplying member 430a between the standby location of the standby port 440a and the processing position at the upper portion of the substrate supporting unit 410.

The treating liquid supplying members 430a, 430b, and 430c may be provided side-by-side parallel to a side of the substrate supporting unit 410, and may be supported by the standby ports 440a, 440b, and 440c. Here in the drawings, reference numeral 430a is a first treating liquid supplying member, reference numeral 430b is a second treating liquid supplying member, and reference numeral 430c is a third treating liquid supplying member. The treating liquid supplying members 430a, 430b, and 430c may have the same configuration, and therefore one of the treating liquid supplying members 430a, 430b, and 430c (i.e., 430c) will be exemplarily described.

Figure 6:
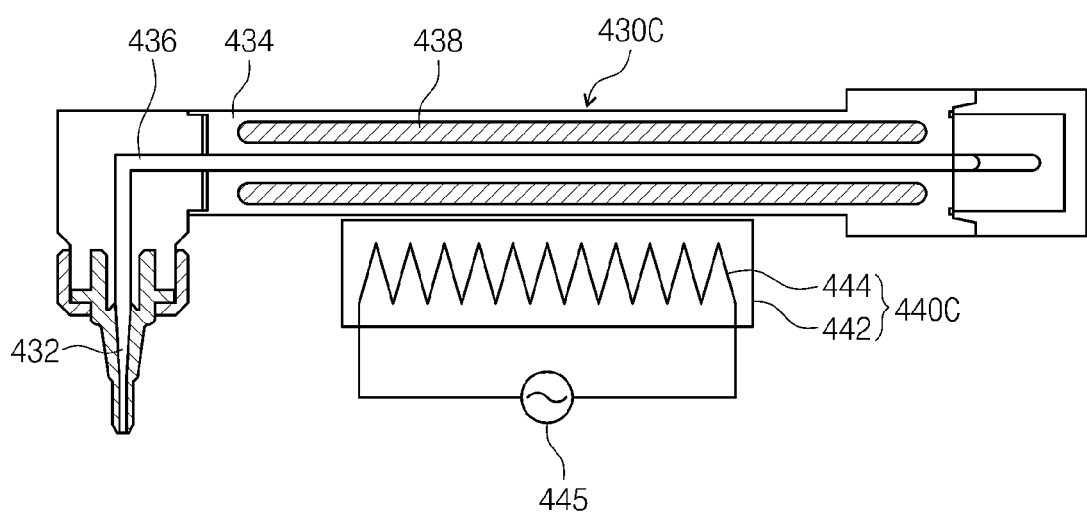
FIGS. 6 through 8 are views illustrating embodiments of a temperature controlling member provided in a standby port.

The treating liquid supplying member 430c, as illustrated in FIG. 6, has a nozzle 432 for discharging treating liquid onto a substrate positioned on a substrate supporting unit (reference numeral 410 in FIG. 4). The nozzle 432 may be installed perpendicularly to an end of a nozzle arm 434. A treating liquid pipe 436 for supplying treating liquid to the nozzle 432 is built into the nozzle arm 434. Also, a heat pipe 438 may be disposed in a space between an inner wall of the nozzle arm 434 and the treating liquid pipe 436. The heat pipe 438 transfers heat between the nozzle arm 434 and the treating liquid pipe 436.

The standby ports 440a, 440b, and 440c provide locations in which the treating liquid supplying members 430a, 430b, and 430c standby for processing. The standby ports 440a, 440b, and 440c are provided side-by-side along a side of the substrate supporting unit 410. The first treating liquid supplying member 430a is disposed in the first standby port 440a, the second treating liquid supplying member 430b is disposed in the second standby port 440b, and the third treating liquid supplying member 430c is disposed in the third standby port 440c. Because the first through third standby ports 440a, 440b, and 440c have the same configuration, the third standby port 440c will be exemplarily described below, and description of the first and second standby ports 440a and 440b will not be provided.

The third standby port 440c, as illustrated in FIG. 6, has an arm supporting member 442 on which a nozzle arm 434 of the third treating liquid supplying member 430c is positioned. The arm supporting member 442 may be provided in a block shape corresponding in length to the nozzle arm 434, and is surface-contacted with the lower portion of the nozzle arm 434 along the lengthwise direction of the nozzle arm 434. A first temperature adjusting member 444 for adjusting the temperature of the arm supporting member 442 may be provided on the arm supporting member 442.

The first temperature adjusting member 444 may be provided as a heating coil. The heating coil is built into the arm supporting member 442, and a power supply 445 for supplying electrical power is connected to the heating coil.

A first temperature adjusting member 444 generates heat by means of the power transferred from the power supply 445, and the heat generated by the first temperature adjusting member 444 is transferred to the arm supporting member 442. The heat transferred to the arm supporting member 442 is transferred to the nozzle arm 434 surface-contacted with the arm supporting member 442. The heat transfer between the arm supporting member 442 and the nozzle arm 434 is achieved through heat conduction. The heat transferred through heat conduction to the nozzle arm 434 is transferred to the treating liquid pipe 436 through the heat pipe 438 within the nozzle arm 434. The heat transferred to the treating liquid pipe 436 is transferred into the treating liquid pipe 436. The temperature of treating liquid may be raised by the received heat that is transferred. Through this process, while the nozzle arm 434 is standing by in the standby port 440c, the temperature of treating liquid within the treating liquid pipe 436 may be adjusted.

Figure 7:
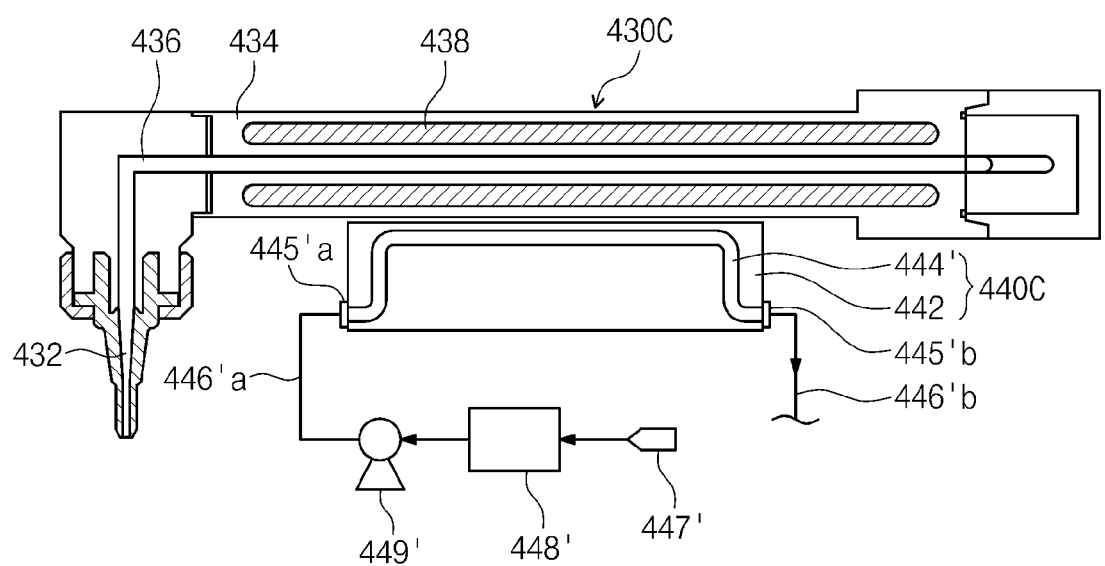

According to another embodiment, as illustrated in FIG. 7, a first temperature adjusting member may be provided as a temperature adjusting liquid pipe 444'. The temperature adjusting liquid pipe 444' may be built into the arm supporting member 442, and temperature adjusted liquid may flow through the temperature adjusting liquid pipe 444'. A liquid supplying line 446'a is connected to an inlet 445'a of the temperature adjusting pipe 444', and a liquid supplying source 447' is connected to the other end of the liquid supply line 446'. A temperature adjuster 448' and a pump 449' may be disposed on the liquid supplying line 446'a between the liquid supplying source 447' and the inlet 445'a. The temperature adjuster 448' heats or cools liquid supplied from the liquid supplying source 447' to adjust the temperature of the liquid, and the pump 449' pumps the liquid adjusted in temperature to the inlet 445'a. A liquid discharging line 446'b is connected to the outlet 445'b of the temperature adjusting pipe 444'.

Liquid that has been adjusted in temperature flowing through the temperature adjusting liquid pipe 444' transfers heat to the arm supporting member 442 or receives heat from the arm supporting member 442. For example, when the temperature of treating liquid inside the treating liquid pipe 436 in the nozzle arm 434 is higher than a required temperature, the temperature adjuster 448' cools the liquid supplied from the liquid supplying source 447' to a temperature lower than that of the treating liquid. The cooler liquid flows through the temperature adjusting liquid pipe 444' to absorb heat from the arm supporting member 442. When the heat from the arm supporting member 442 is transferred to the cooler liquid, it is transferred in sequence from the nozzle arm 434 to the arm supporting member 442, from the heat pipe 438 to the nozzle arm 434, and from the treating liquid pipe 436 to the heat pipe 438, thereby lowering the temperature of the treating liquid in the treating liquid pipe 436.

Also, when the temperature of treating liquid inside the treating liquid pipe 436 in the nozzle arm 434 is lower than a required temperature, the temperature adjuster 448' heats the liquid supplied from the liquid supplying source 447' to a temperature higher than that of the treating liquid. The hotter liquid flows through the temperature adjusting liquid pipe 444' to transfer heat to the arm supporting member 442. When heat is transferred to the arm supporting member 442 from the hotter liquid, it is transferred in sequence from the arm supporting member 442 to the nozzle arm 434, from the nozzle arm 434 to the heat pipe 438, and from the heat pipe 438 to the treating liquid pipe 436, thereby raising the temperature of the treating liquid in the treating liquid pipe 436.

Figure 8:
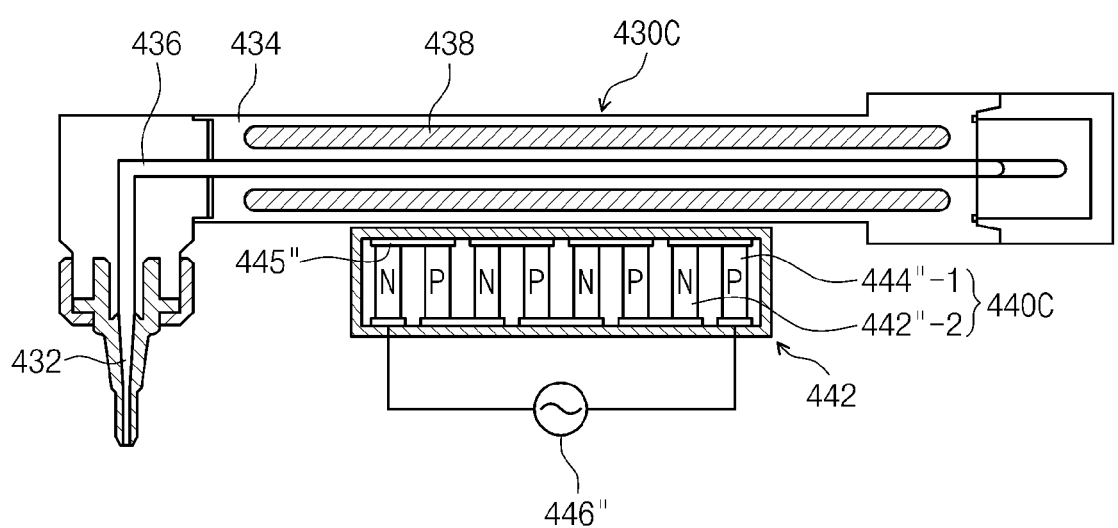

In another example, referring to FIG. 8, a first temperature adjusting member may be provided as thermoelectric elements 444"-1 and 444"-2. The thermoelectric elements 444"-1 and 444"-2 have P-type elements 444"-1 and N-type elements 444"-2 and are built into the arm supporting member 442. The P-type elements 444"-1 and the N-type elements 444"-2 are arranged in alternating order along the lengthwise direction of the arm supporting member 442. Neighboring P-type elements 444"-1 and N-type elements 444"-2 are connected by heating plates 445", where the P-type elements 444"-1 and the N-type elements 444"-2 are connected to one another in alternation at the top ends and bottom ends thereof. A power source 446" is connected to the heating plates 445", and the direction of current supplied from the power source 446" to the heating plates 445" may be reversed.

When the direction of the current from the power source 446" is reversed, the heating plates 445" connecting the tops of the thermoelectric elements 444"-1 and 444"-2 may be heated or cooled. If the heating plates 445" are heated, heat is transferred from the heating plates 445" to the arm supporting member 442, and when the heating plates 445" are cooled, heat is transferred from the arm supporting member 442 to the heating plates 445".

For example, when the temperature of treating liquid inside the treating liquid pipe 436 in the nozzle arm 434 is higher than a required temperature, a current is applied to the thermoelectric elements 444"-1 and 444"-2 to cool the heating plates 445". Then, the heating plates 445" absorb heat from the arm supporting member 442. When heat from the arm supporting member 442 is transferred to the heating plates 445", heat is transferred in sequence from the nozzle arm 434 to the arm supporting member 442, from the heat pipe 438 to the nozzle arm 434, and from the treating liquid pipe 436 to the heat pipe 438, to lower the temperature of the treating liquid in the treating liquid pipe 436.

Also, when the temperature of treating liquid inside the treating liquid pipe 436 in the nozzle arm 434 is lower than a required temperature, a current is applied to the thermoelectric elements 444"-1 and 444"-2 to heat the heating plates 445". Then, the heating plates 445" transfer heat to the arm supporting member 442. When heat is transferred to the arm supporting member 442 from the heating plates 445", heat is transferred in sequence from the arm supporting member 442 to the nozzle arm 434, from the nozzle arm 434 to the heat pipe 438, and from the heat pipe 438 to the treating liquid pipe 436, to raise the temperature of the treating liquid in the treating liquid pipe 436.

Referring again to FIGS. 4 and 5, the nozzle moving unit 500 selects one of the treating liquid supplying members 430a, 430b, and 430c (for example, 430a), and moves the selected treating liquid supplying member 430a between the standby position of the standby port 440a and the processing position at the upper portion of the substrate supporting unit 410.

The nozzle moving unit 500 includes a holding member 510, a second temperature adjusting member 520, and a moving member 530. The holding member 510 may hold the nozzle arm 434 of the treating liquid supplying member 430a. The second temperature adjusting member 520 is provided on the holding member 510 to adjust the temperature of the holding member 510. The temperature of treating liquid within the treating liquid pipe (436 in FIG. 6) built into the nozzle arm 434 held by the holding member 510 may be adjusted through temperature adjustment of the holding member 510. The moving member 530 moves the holding member 510 to move the treating liquid supplying member 430a held in the holding member 510 between the standby location and the processing location.

Figure 9:
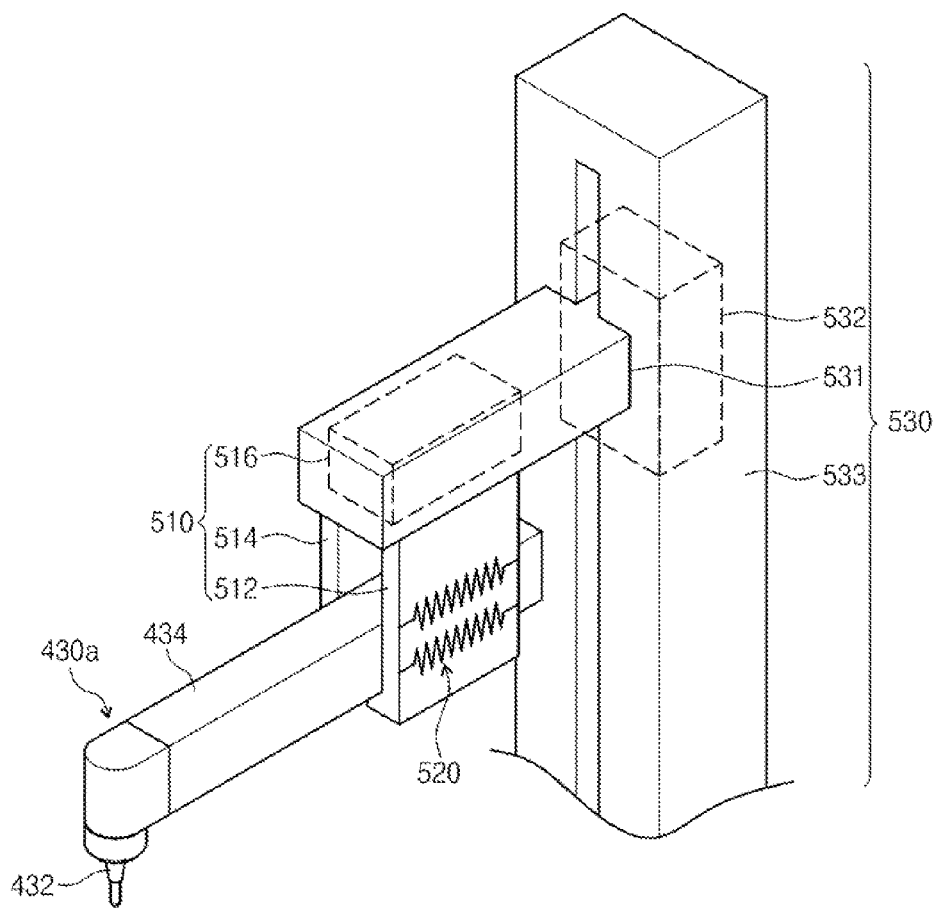
FIGS. 9 through 11 are views illustrating embodiments of temperature controlling members provided on a nozzle moving unit.

The holding member 510, as illustrated in FIG. 9, includes a first and a second holders 512, 514, and a first driver 516. The first and second holders 512 and 514 may hold the nozzle arm 434 by moving farther away from or closer to one another along a direction perpendicular to the lengthwise direction of the nozzle arm 434. In detail, the first and second holders 512 and 514 may respectively have sidewalls disposed perpendicularly to the sides of the nozzle arm 434, and bottom walls extending horizontally from the sidewalls to contact the bottom of the nozzle arm 434. The top ends of the sidewalls of first and second holders 512 and 514 are connected to the first driver 516. The first driver 516 may move the first and second holders 512 and 514 away from or closer to one another linearly along a direction perpendicular to the lengthwise direction of the nozzle arm 434.

Figure 10:
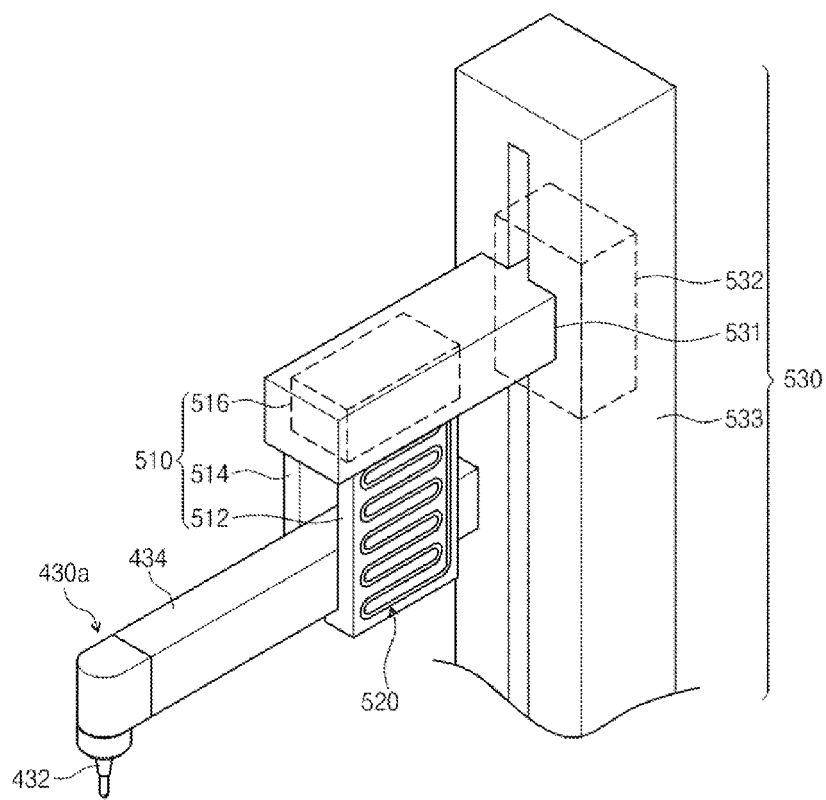
Figure 11:
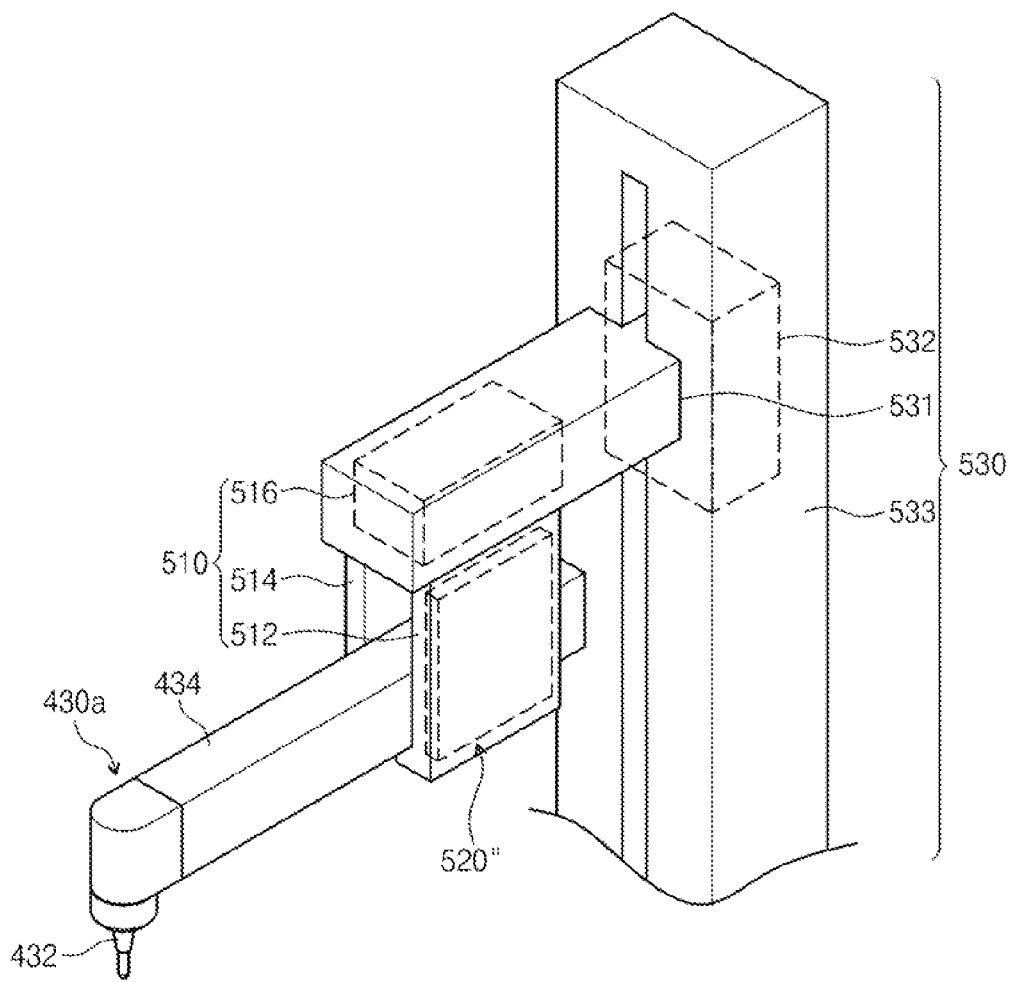

The second temperature adjusting member 520 adjusts the temperature of the holding member 510. By adjusting the temperature of the holding member 510, heat conduction occurs between the nozzle arm 434 held by the holding member 510 and the holding member 510, so that the temperature of treating liquid in the treating liquid pipe (436 in FIG. 6) built into the nozzle arm 434 can be adjusted. The second temperature adjusting member 520, as illustrated in FIG. 9, may be contained in the first and second holders 512 and 514, and a heating coil may be used as the second temperature adjusting member 520. Also, the temperature adjusting liquid pipe 520' or the thermoelectric element 520" in FIGS. 10 and 11, or a combination thereof may be used as the second temperature adjusting member.

Because the temperature adjusting mechanism for treating liquid in the treating liquid pipe (436 in FIG. 6) using the second temperature adjusting members 520, 520', and 520" is similar to that using the first temperature adjusting members 444, 444', 444"-1, and 444"-2, detailed descriptions thereof will not be provided. However, while the first temperature adjusting members 444, 444', 444"-1, and 444"-2 are provided in fixed standby ports 440a, 440b, and 440c, the second temperature adjusting members 520, 520', and 520" can adjust the temperature of treating liquid in the treating liquid pipe while the treating liquid supplying members 430a, 430b, and 430c are moving because the holding member 510 that moves between the standby location and processing location is provided.

The moving member 530 has a horizontal support 531 that supports the holding member 510. The horizontal support 531 is provided horizontally, with its lengthwise direction toward the lengthwise direction of the nozzle arm 434. The horizontal support 531 is coupled to a moving rod 533 disposed perpendicularly to the horizontal support 531, and a second driver 532 is installed on the moving rod 533 to move the horizontal support 531 vertically.

A connecting member 534 is coupled at a lower end of the moving rod 533, and the connecting member 534 is connected to a guiding member 535. The guiding member 535 is disposed at one side of the substrate supporting unit 410 in parallel to the arranged direction of the standby ports 440a, 440b, and 440c. The guiding member 535 may be provided in the form of a guide rail, and guides linear movement of the moving rod 533. Also, a lead screw 537 disposed parallelly with the guiding member 535 may be connected to the connecting member 534, and a third driver 536 may be connected at one end of the lead screw 537 to rotate the lead screw 537. When rotational force from the third driver 536 is transmitted to the lead screw 537, the rotation of the lead screw 537 causes linear movement of the connecting member 534 coupled to the lead screw 537. Then, the moving rod 533 to which the connecting member 534 is coupled, and the horizontal support 531 with the moving rod 523 connected thereto move linearly, and the treating liquid supplying member 430a held by the holding member 510 can move between the standby location and the processing location.

As described above, a substrate processing apparatus according to embodiments can adjust the temperature of treating liquid in a treating liquid pipe provided in a nozzle arm not only while the nozzle arm is standing by in standby position, but also while it is moving between the standby position and a processing position. Also, through the above-described configuration, the temperature of treating liquid can be adjusted during processing at a processing position.

Typically, a constant water temperature pipe is installed in a nozzle arm to adjust the temperature of treating liquid inside a treating liquid pipe, increasing conveying loads from the constant water temperature pipe, and inviting the possibility of leaks from damaged pipes. In present embodiments, however, a constant water temperature pipe is not installed in a nozzle arm, and a separate temperature adjusting member is installed in a standby port and a nozzle moving unit instead, so that conveying loads are reduced when the nozzle arm is conveyed, and leaks from damaged pipes within the nozzle arm can be prevented.

According to the present invention, treating liquid supplied through a nozzle arm can be maintained at a predetermined temperature while the nozzle arm is standing by in standby position, while processing is being performed at a processing position, and during movement between the standby position and a processing position.

While this invention has been particularly shown and described with reference to preferred embodiments thereof, it will be understood by those skilled in the art that various changes in form and details may be made therein without departing from the spirit and scope of the invention. The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate processing apparatus comprising:
    a substrate supporting unit for supporting a substrate;
    a nozzle arm extending in a lengthwise direction and having a treating liquid pipe built therein for supplying treating liquid, the nozzle arm further comprising a heat pipe disposed between an inner wall of the nozzle arm and the treating liquid pipe, for transferring heat between the nozzle arm and the treating liquid pipe;
    a treating liquid supplying member mounted on one end portion of the nozzle arm including a nozzle for discharging the treating liquid to the substrate placed on the substrate supporting unit; and
    a nozzle moving unit for picking up the nozzle arm from a standby location, moving the nozzle arm to a processing location above the substrate, and adjusting a temperature of the treating liquid in the treating liquid pipe through heat transfer with the nozzle arm; and
    a standby port providing the standby location in which the nozzle arm stands by, wherein the standby port adjusts the temperature of the treating liquid in the treating liquid pipe built in the nozzle arm through heat transfer with the nozzle arm while the nozzle arm is not being held by the nozzle moving unit, and the standby port is located separate from the processing location and the substrate,
    wherein the standby port comprises:
        an arm supporting member having a block shape with a length corresponding to the length of the nozzle arm, wherein the nozzle arm is placed on the arm supporting member and the arm supporting member contacts a lower end surface of the nozzle arm along the lengthwise direction of the nozzle arm; and
        a first temperature adjusting member built in the arm supporting member, for adjusting a temperature of the arm supporting member to transfer heat to the nozzle arm through contact with the lower end surface of the nozzle arm.

2. The substrate processing apparatus of claim 1, wherein the nozzle moving unit comprises:
    a second temperature adjusting member provided on a holding member, for adjusting a temperature of the holding member; and
    a moving member for moving the holding member between the standby location and the processing location,
    wherein the holding member comprises:
        a first holder and a second holder for holding the nozzle arm, wherein the first holder and the second holder move farther from or closer to one another along directions perpendicular to the lengthwise direction of the nozzle arm; and
        a first driver for driving the first holder and the second holder;
    wherein the first holder and the second holder respectively include a sidewall disposed perpendicularly in contact with a side of the nozzle arm, and a bottom wall extending horizontally from the sidewall to contact a bottom of the nozzle arm,
    wherein the second temperature adjusting member is contained in the sidewalls of the first holder and the second holder, and
    wherein the first temperature adjusting member and the second temperature adjusting member are one of a heating coil, a temperature adjusting liquid pipe, a thermoelectric element, or a combination thereof.

3. The substrate processing apparatus of claim 1,
    wherein the standby port is provided in plurality in side-by-side arrangement along a side of the substrate supporting unit,
    wherein the nozzle arm with the nozzle mounted thereon is respectively disposed at each of the standby ports, and
    wherein the nozzle moving unit selects and picks up one from a plurality of nozzle arms and moves a selected nozzle arm from the standby location to the processing location above the substrate.

* * * * *